Figure 1:
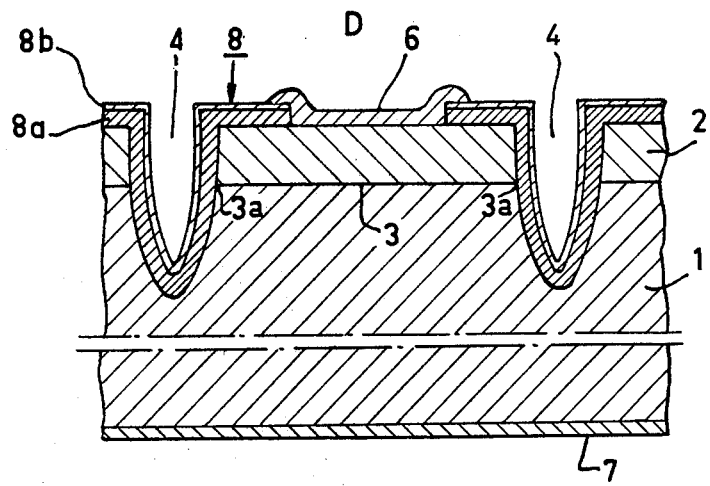

United States Patent [19]
Biet et al.

[11] 4,086,613
[45] Apr. 25, 1978

[54] SEMICONDUCTOR DEVICE HAVING A PASSIVATED SURFACE AND METHOD OF MANUFACTURING THE DEVICE

[75] Inventors: Jean-Pierre Henri Biet, Caen; Sio Dhat Laou, Herouville St-Clair, both of France

[73] Assignee: U.S. Philips Corporation, New York, N.Y.

[21] Appl. No.: 748,697

[22] Filed: Dec. 8, 1976

[30] Foreign Application Priority Data

Dec. 19, 1975 France .................. 75 39046

[51] Int. Cl.$^2$ .............. H01L 29/34; H01L 27/12; H01L 29/06; H01L 29/04
[52] U.S. Cl. .................... 357/54; 357/49; 357/50; 357/55; 357/59
[58] Field of Search ............ 357/59, 49, 50, 54, 357/55

[56] References Cited

U.S. PATENT DOCUMENTS

| 3,971,061 | 7/1976 | Matsushita et al. | 357/59 |
| 4,001,762 | 1/1977 | Aoki et al. | 357/59 |
| 4,009,484 | 2/1977 | Ogiue et al. | 357/59 |

*Primary Examiner*—Edward J. Wojciechowicz
*Attorney, Agent, or Firm*—Frank R. Trifari; Steven R. Biren

[57] ABSTRACT

A semiconductor device in which at least a part of the active surface is covered by a passivating combined layer. According to the invention the passivating combined layer comprises two layers of the same semiconductor material lying one on top of the other, the lowermost layer having a resistivity of at least $10^{10}$ ohm.cm, and the layer present thereon having a resistivity of at most $10^8$ ohm.cm.

12 Claims, 2 Drawing Figures

SEMICONDUCTOR DEVICE HAVING A PASSIVATED SURFACE AND METHOD OF MANUFACTURING THE DEVICE

The invention relates to a semiconductor device having a semiconductor body comprising at least a p-n junction intersecting the surface of the body, the surface being covered with a passivating layer of semiconductor material at least at the area of the p-n junction. Such a semiconductor device is known, for example, from "Electronics", June 16, 1975, pages 5E and 6E.

The expression "passivating layer" is to be understood to mean herein a layer which physically and chemically protects the semiconductor surface covered by said layer and in addition makes the semiconductor layer electrically independent of external charges which might impede the operation of the device.

It is known that generally the active surface of a semiconductor device should be passivated at least at the area of the p-n junction or junctions so as to stabilize the electrical properties of said p-n junctions. Said passivation should be carried out very carefully when it concerns devices which are to operate at high voltages.

The most frequently used solution to passivate a semiconductor device is the provision on an active surface of the said device of a silicon dioxide layer which covers the said active surface entirely or partly. Polymers of silicone lacquers are also used for passivating purposes. However, the drawback of said materials is either that they are only moderately effective or that the provision thereof is difficult.

Silicon dioxide itself has several drawbacks. On the one hand the resistivity thereof is very high. This has for its result that positive or negative electrical charges, if any, which occur on the surface which is in contact with the atmosphere, which charges may be the result of impurities in the surrounding atmosphere or may be the result of various electrical fields, can flow away to the mass of the underlying substrate only with difficulty and thus move over the surface in a very irregular manner. The result of this is that the said charges may give rise to important variations of the characteristics of the said semiconductor devices; in particular the breakdown voltages of the said p-n junctions may vary between very wide limits. It is also known that charges may be stored in the silicon dioxide itself, for example as a result of the presence of sodium ions. The said charges may also move and give rise to undesired electrical effects at the semiconductor surface covered by silicon dioxide.

In addition it is known that silicon dioxide does not provide an absolute sealing with respect to moisture or other gaseous constituents. This "permeability" is also a source of irregular operation of the semiconductor device.

It has been endeavoured to replace silicon dioxide as a passivating agent by several other materials, for example, silicon nitride. The use of silicon nitride, however, remains an exception because the temperature necessary for the growth of silicon nitride is high and in addition silicon nitride is often not sufficiently electrically passive.

The most recently proposed improvement is the use of oxygen-doped polycrystalline silicon as a passivating layer. The insulating and passivating properties of polycrystalline silicon, either in the undoped condition or doped with, for example, arsenic, were known and have been used before. It has been found in addition that the passivating properties of oxygen doped polycrystalline silicon are exceptionally good. The advantages of the use thereof are described in the article "Polysilicon layer Doped With Oxygen Improves Devices" in "Electronics", pages 5E and 6E, June 26, 1975. This article deals with the passivation of semiconductor devices by providing one single surface layer of oxygen-doped polycrystalline silicon.

The particular advantage of the use of polycrystalline silicon resides in its electrical neutrality which is not disturbed by the presence of foreign ions in the layer, for example silicon dioxide in which sodium ions occur. As a result of this the provision of said material on the surface of a semiconductor device does not form a source of irregularities in the operation of the device. On the other hand, the oxygen-doped polycrystalline silicon is also suitable for covering mesa-junctions due to the fact that the growth temperature (between 650° C and 850° C) is sufficiently low to cause no damage to the p-n junctions already formed. It has been found in addition that polycrystalline silicon does not pass moisture.

The use of polycrystalline silicon as described in the said article, that is the use of a single homogeneous layer of oxygen-doped polycrystalline silicon covered, if desired, with a silicon dioxide layer so as to reduce the influence of leakage currents, however, has an important drawback. The resistivity of oxygen-doped polycrystalline silicon is very high, namely in the order of $10^{10}$ ohm cm. As a result of this, parasitic charges on the surface exposed to the atmosphere can flow away to the underlying substrate only with difficulty, just as in the case of silicon dioxide; the result of this is that, as already stated above in relation to the use of silicon dioxide, the characteristics of the semiconductor devices passivated in this manner and the breakdown voltages of their p-n junctions are influenced in an undesired manner.

One of the objects of the invention is to provide passivating layers having an improved passivating character which not only do not show any parasitic internal charge but which in addition eliminate the detrimental effects of charges of different polarities and densities which may be present at the surface exposed to the atmosphere.

As a result of this the invention contributes to the construction of semiconductor devices the electrical properties of which are stable and which have readily defined breakdown voltages which are significantly better in comparison with the properties of analog devices which are passivated according to the known classical methods.

The invention is based inter alia on the recognition of the fact that the end in view can be achieved by using a passivating layer with nonhomogeneous doping.

According to the invention, a semiconductor device of the kind described in the preamble is characterized in that the passivating layer comprises a first semiconductor layer which is situated on the said surface and has a resistivity of at least $10^{10}$ ohm.cm and a second semiconductor layer which is present thereon and has a resistivity of at most $10^8$ ohm.cm.

The device according to the invention has a passivating layer composed of a first semiconductor layer of a very high resistivity and a second semiconductor layer of a comparatively lower, although still high, resistivity. As a result of this, charges on the surface of the second semiconductor layer can flow away via said semiconductor layer, for example, to a neutral zone or to a zone having a fixed potential, for example to earth. As a result of this the manufactured device obtains the desired stable electrical characteristics. On the other hand, due to the absence of charges on and in the passivating layer, the field lines at the level of the p-n junctions are regularly distributed, which ensures high breakdown voltages which in addition are readily defined.

Advantageously, the first and second layers may be provided one after the other in one uninterrupted process step.

The said semiconductor material may be a single element, for example germanium or silicon. Alternatively, a semiconductor compound, for example a III-V compound, for example GaAs, may also be used advantageously.

Advantageously, silicon is selected as a semiconductor material and oxygen as a dopant. A very advantageous embodiment of a device according to the invention is characterized in that the first semiconductor layer has a doping of at least 15 and at most 25 oxygen atoms per 100 silicon atoms, a thickness of at least 0.5 micron and at most 1 micron and a resistivity of at least $10^{10}$ and at most $10^{11}$ ohm.cm, and that the said second semiconductor layer has a doping of at most 1 oxygen atom per 100 silicon atoms, a thickness of at least 0.2 micron and at most 0.3 micron, and a resistivity of at least $10^6$ ohm.cm and at most $10^8$ ohm.cm.

The thickness of the first and second semiconductor layer may differ in accordance with the type of device which is to be passivated. The thickness of the first semiconductor layer preferably is between $0.5\mu$ and $1\mu$, the thickness of the second semiconductor layer preferably not exceeding $0.3\mu$.

Figure 2:
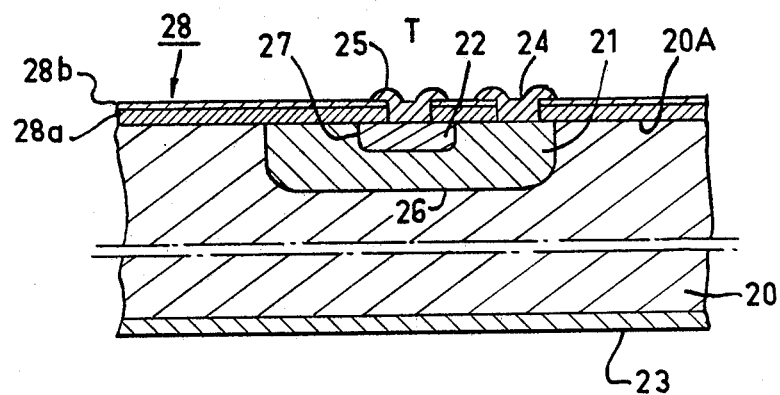

The invention will now be described in greater detail with reference to the accompanying drawing, in which:

FIG. 1 is a diagrammatic cross-sectional view of a diode which is obtained according to the mesa technology and the active surface of which is covered with a passivating layer according to the invention, and FIG. 2 is a diagrammatic cross-sectional view of a device according to the invention having a transistor obtained according to the planar technology.

The device shown in FIG. 1 comprises a semiconductor substrate 1 of a first conductivity type, for example n-type; provided on the surface of the said substrate is a layer 2 of the opposite conductivity type, so in this example of the p-type. It will be obvious that the conductivity types may also be reversed so that the substrate 1 may also be of the p-type and the layer 2 of the n-type. The regions 1 and 2 constitute a p-n junction 3. According to the usual mesa technology a groove 4 is provided which extends down into the substrate 1. In this manner the mesa diode D of known structure is obtained. The electrodes of the diodes D are formed by the metal layers 6 and 7 of which the layer 6 is provided on the free surface of the layer 2 and the layer 7 is provided on the rear surface of the substrate 1.

It will be obvious that the p-n junction 3 is uncovered on its line of intersection 3a with the groove 4. Especially at this area the diode should be protected physically, electrically and chemically by an electrically neutral and impervious layer. Although the passivation is of particular importance on the line of intersection 3a of the p-n junction 3 with the groove 4, it should not be neglected in the other exposed regions of the diode. Therefore, the active surface of the device is preferably covered entirely by a passivating layer, the electrode 6 excepted.

According to the invention the passivating layer is obtained by providing a combined layer 8 which is formed by two semiconductor layers lying one above the other, namely a first layer 8a the resistivity of which is at least $10^{10}$ ohm.cm, and an uppermost second layer 8b the resistivity of which is at most $10^8$ ohm.cm.

The simultaneous presence of the layers 8a and 8b ensures proper electrical insulation in both directions between the diode elements, namely the direction which is parallel to the surface of the said semiconductor layers and the direction normal thereto. In most cases this insulation is sufficient, even for diodes which are to operate at voltages of at least 1000 to 2000 Volts.

In addition, due to the use of a second layer 8b, the resistivity of which is large, although smaller than that of the layer 8a, it is possible to cause charges which may be present at the surface exposed to the atmosphere to flow away to regions which are situated farther away from the p-n junction 3. In this manner the said charges cannot exert undesired influences on the p-n junction 3, in particular in the most sensitive region 3a of said p-n junction; as a result of this excellent electrical stability is obtained and in addition a high and readily defined breakdown voltage is achieved.

It is advantageous when the passivating layer 8 consists of polycrystalline silicon which is doped with oxygen in a ratio of at least 15 and at most 25 oxygen atoms per 100 silicon atoms as far as the layer 8a is concerned, whereas the polycrystalline silicon which forms the layer 8b is not or slightly doped with oxygen. Typically, the thickness of the layer 8a may be 0.5 $\mu$ to 1 $\mu$, and that of the layer 8b may be 0.2 $\mu$ to 0.3 $\mu$.

As a second embodiment of the invention, FIG. 2 shows a part of a semiconductor device which comprises a transistor which has been manufactured in accordance with planar technology. In FIG. 2 a substrate 20 is shown having a transistor T with diffused base electrode 21 and with diffused emitter electrode 22. The necessary contacts to the collector substrate 20, the base electrodes 21 and the emitter electrode 22 are realized via metal layers 23, 24 and 25.

According to the invention, the whole active surface 20A of the device, the contact zones below the layers 24 and 25 excepted, is covered with a passivating layer 28 analogous or identical to the layer 8 of FIG. 2. The layer 28 is formed by a first layer 28a having a resistivity of at least $10^{10}$ ohm.cm and a second layer 28b the resistivity of which is lower than that of the layer 28 and is at most $10^8$ ohm.cm. The passivating layer 28 covers in particular the zones where the collector-base junction 26 and the base-emitter junction 27 adjoin the active surface 20A. Said zones which are very sensitive to the influence of parasitic surface charges are correctly passivated in this manner.

Although in the examples the second semiconductor layer is exposed to the atmosphere, one or more dielectric layers may be provided on said layer, if desired, in as far as at least said dielectric layers or their surfaces comprise no electric charges.

It will be obvious that for the manufacture of devices as shown in FIGS. 1 and 2 the insulation layers which were provided on the active surface of the device in the form of etching masks or diffusion masks and which may still be present, have to be removed prior to providing the passivating layers 28 and 8. Otherwise it will be necessary to selectively etch the passivating layers 8 and 28 so as to provide therein the apertures necessary for providing the contacts. In the case of passivating layers of polycrystalline silicon, this is done via the conventional methods, by a chemical etching treatment.

The method of providing a passivating layer according to the invention in which polycrystalline silicon is used as a basic material has for its main characteristic feature that the first and second semiconductor layers are obtained via one single uninterrupted process step.

The growth of the passivating layer is carried out by decomposition of silane ($SiH_4$) and of nitrous oxide ($N_2O$) in the presence of nitrogen in a vacuum or in an open tube, in a furnace at a temperature of at least 650° C and at most 850° C (the preferred temperature is at least 740° C and at most 760° C).

In a first phase which corresponds to the growth of the first layer (8a or 28a) the quantity of silane is equal to at least 0.1 and at most 0.3 percent by volume of the quantity of nitrogen, while the quantity of nitrous oxide is at least 1 and at most 10 percent by volume of the quantity of nitrogen (in accordance with the desired doping concentration and the resulting resistivity of the said layers). In these circumstances the thickness growth per minute is 0.03 to 0.06 micron, which means a time of 8 to 15 minutes for providing a layer whose thickness is 0.5 micron.

In a second phase necessary to form the uppermost second layer 8b or 28b, only one variation is carried out as compared with the above-stated data of the quantity of $N_2O$ which at any rate is smaller than in the formation of the first layers 8a and 28a, respectively. It is known that the resistivity of polycrystalline silicon decreases with the oxygen concentration. When no nitrous oxide is used, or when the quantity of nitrous oxide is only equal to 1% by volume of the quantity of nitrogen, a thickness growth is realized per minute of 0.05 to 0.01 micron. This means that the provision of a layer 8b or 28b whose thickness is 0.2 $\mu$ requires a time of 2 to 3 minutes.

It will be obvious that the above-stated values represent a particular example only and that they are specific in terms of a method of providing the desired results in a given reactor. What is essential is that the method is very flexible, since only one single process step is necessary to form the two layers of the structure, in which only the quantity of $N_2O$ should be varied during the process.

The above-described manner of providing enables inter alia the manufacture of a mesa device of silicon which is protected by a passivating layer of polycrystalline silicon, in which the first oxygen-doped, layer has a resistivity of $100^{10}$ to $10^{11}$ ohm.cm, whereas the second layer which is doped only comparatively weakly with oxygen has a resistivity of $10^6$ to $10^8$ ohm.cm, while the breakdown voltages of the resulting p-n junctions are approximately 1000 volts, and this in a reproducible manner. The invention is not restricted to the examples described, and notably the semiconductor material of the passivating layer, as well as the doping thereof, and the semiconductor material of the passivated silicon body of the materials and dopants mentioned in the examples may differ.

We claim:

1. A semiconductor device comprising a semiconductor body portion of a first conductivity type having a semiconductor region of the opposite type forming with said body portion a p-n junction which intersects the surface of the body portion, and a passivating combined layer on said body portion surface and at least at the area of said p-n junction, said combined layer comprising a first semiconductor layer portion said body portion surface and having a resistivity of at least $10^{10}$ ohm.cm and a second semiconductor layer portion on said first layer portion and having a resistivity of at most $10^8$ ohm.cm.

2. A semiconductor device as claimed in claim 1, wherein the semiconductor material in said semiconductor combined layer comprises a single semiconductor element.

3. A semiconductor device as claimed in claim 1, wherein the semiconductor material in said semiconductor combined layer comprises a semiconductor compound.

4. A semiconductor device as claimed in claim 2, wherein said single semiconductor element comprises polycrystalline silicon.

5. A semiconductor device as claimed in claim 4, wherein at least the first semiconductor layer portion comprises oxygen-doped polycrystalline silicon.

6. A semiconductor device as claimed in claim 4, wherein the second semiconductor layer portion comprises substantially non-oxygen-doped polycrystalline silicon.

7. A semiconductor device as claimed in claim 5, wherein the first semiconductor layer portion has a doping of at least 15 and at most 25 oxygen atoms per 100 silicon atoms, a thickness of at least 0.5 micron and at most 1 micron and a resistivity of at least $10^{10}$ and at most $10^{11}$ ohm.cm, and the second semiconductor layer portion has a doping of at most 1 oxygen atom per 100 silicon atoms, a thickness of at least 0.2 micron and at most 0.3 micron, and a resistivity of at least $10^6$ ohm.cm and at most $10^8$ ohm.cm.

8. A method of providing a passivating combined layer on a semiconductor body portion having a p-n junction which intersects the surface of the body portion, the passivating combined layer comprising a first semiconductor layer portion on said body portion surface and having a resistivity of at least $10^{10}$ ohm.cm and a second semiconductor layer portion on said first layer portion and having a resistivity of at most $10^8$ ohm.cm, which method comprises the step of providing the passivating combined layer by decomposing a gas current containing silane, nitrous oxide and nitrogen at a temperature of at least 650° C and at most 850° C.

9. A method as claimed in claim 8, wherein said passivating combined layer is provided at a temperature of at least 740° C and at most 760° C.

10. A method as claimed in claim 8, wherein the step of providing the passivating combined layer takes place in a continuous process.

11. A method as claimed in claim 10, wherein during the provision of the first semiconductor layer portion of the combined passivating layer the quantity of silane is at least 0.1% by volume and at most 0.3% by volume of the quantity of nitrogen, and the quantity of nitrous oxide is at least 1% by volume and at most 10% by volume of the quantity of nitrogen, and wherein during the provision of the second semiconductor layer portion of the combined passivating layer the quantity of nitrous oxide is reduced to at most 1% by volume of the quantity of nitrogen while the quantities of silane and nitrogen remain constant.

12. A method as in claim 11, wherein during the provision of the second semiconductor layer portion no nitrous oxide is present so that a substantially non-oxygen-doped second semiconductor layer portion is obtained.

* * * * *

UNITED STATES PATENT OFFICE
CERTIFICATE OF CORRECTION

Patent No. 4086613     Dated April 25, 1978

Inventor(s) JEAN-PIERRE HENRI BIET

It is certified that error appears in the above-identified patent and that said Letters Patent are hereby corrected as shown below:

Column 6, line 1, after "portion" insert -- on --.

Signed and Sealed this

Third Day of October 1978

[SEAL]

Attest:

RUTH C. MASON
Attesting Officer

DONALD W. BANNER
Commissioner of Patents and Trademarks